US009654145B1

(12) United States Patent
Derras et al.

(10) Patent No.: US 9,654,145 B1
(45) Date of Patent: May 16, 2017

(54) INTERLEAVING CODE-WORDS (71) Applicant: Seagate Technology LLC, Cupertino, CA (US)

(72) Inventors: Belkacem Derras, Longmont, CO (US); Deepak Sridhara, Longmont, CO (US); Richard Parshall, Shrewsbury, MA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 46 days.

(21) Appl. No.: 14/552,207

(22) Filed: Nov. 24, 2014

(51) Int. Cl.
*G06F 11/10* (2006.01)
*H03M 13/27* (2006.01)

(52) U.S. Cl.
CPC ..... *H03M 13/2782* (2013.01); *G06F 11/1076* (2013.01)

(58) Field of Classification Search
CPC .................................................. G06F 11/1008
USPC ................................ 714/776, 790, 795, 784
See application file for complete search history.

(56) References Cited

U.S. PATENT DOCUMENTS

| | | | | |
|---|---|---|---|---|
| 5,576,707 A | * | 11/1996 | Zook | H04L 25/497 341/107 |
| 5,584,032 A | * | 12/1996 | Hyatt | G06F 3/14 711/100 |
| 6,269,326 B1 | * | 7/2001 | Lejeune | G01R 31/2834 700/121 |
| 6,694,477 B1 | * | 2/2004 | Lee | H03M 13/03 714/755 |
| 7,415,584 B2 | | 8/2008 | Gibb et al. | |
| 8,020,064 B2 | | 9/2011 | Zheng et al. | |
| 8,112,697 B2 | * | 2/2012 | Anand | H03M 13/2957 370/241 |
| 8,351,541 B2 | | 1/2013 | Taylor et al. | |
| 9,362,954 B1 | * | 6/2016 | Sridhara | H03M 13/27 |
| 2003/0041293 A1 | | 2/2003 | Zheng et al. | |
| 2005/0114421 A1 | | 5/2005 | Gibb et al. | |
| 2008/0074300 A1 | * | 3/2008 | Cherubini | H03M 7/46 341/120 |
| 2012/0189079 A1 | | 7/2012 | Taylor et al. | |
| 2013/0187798 A1 | * | 7/2013 | Marpe | H03M 7/4081 341/67 |

* cited by examiner

*Primary Examiner* — Fritz Alphonse
(74) *Attorney, Agent, or Firm* — Holzer Patel Drennan (57) ABSTRACT

A storage device disclosed herein includes a memory and a write channel configured to interleave a plurality of code-words to generate a plurality of multiplet sequences such that at least two of the plurality of code-words interleave to the end of the interleaving process. In one example implementation, for each of the multiplet sequences no two successive multiplets are from the same code-word, a multiplet including a plurality of bits from a single code-word.

23 Claims, 9 Drawing Sheets

INTERLEAVING CODE-WORDS

SUMMARY

The present disclosure provides systems and methods of a storage device channel. In certain embodiments, an apparatus can comprise a memory and a write channel configured to interleave a plurality of code-words to generate a plurality of multiplet sequences such that at least two of the plurality of code-words interleave to the end of the interleaving process. In one embodiment, for each of the multiplet sequences no two successive multiplets are from the same code-word, a multiplet including a plurality of bits from a single code-word.

In other embodiments, an apparatus can comprise a memory and a write channel configured to interleave a plurality of code-words to generate a plurality of multiplet sequences, wherein each of the code-words is an error-correcting code (ECC) code-word. In one embodiment of such an apparatus, the plurality of code-words includes at least three code-words.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following detailed description.

DETAILED DESCRIPTION

The present disclosure is generally related to digital communications channels and data channels having memory and more specifically to storage device channel encoding and decoding. While this description discusses disc-based storage media as an example storage device, the systems and methods detailed herein can be applied to any communications channel with a memory.

Communication channels with memory use permuters to overcome errors in the communication channel. For example, hard disk drives, where burst errors are very common due to media defects, use permuters to reduce such burst errors. An implementation of such a permuter described herein interleaves multiplets (a certain number of bits) from a plurality of code-words such that no two multiplets are selected from the same code-words. Furthermore, the permuter interleaves the multiplets such that at least two of the code-words keep interleaving until the end of the interleaving process. For example in the case where the permuter is using four code-words, the permuter uses a particular interleaving procedure (algorithm) for each of the possible eight combinations of the code-words lengths to interleave the multiplets from the different code-words (as further described below). In addition to reducing the sensitivity of the resulting sequence to burst errors, the interleaving disclosed herein also distributes the inter-symbol interference (ISI) for hard disc drive across different code-words. Furthermore, such interleaving also results in stronger code-words helping weaker code-words during the decoding process.

In various implementations disclosed herein, the code-words may be ECC code-words. Such ECC code-words may use low-density parity-check (LDPC) code, Reed-Solomon (RS) code, BCH code, or any combination of such codes. Furthermore, the method of interleaving disclosed herein may be used by subsections of code-words. For example, the method of interleaving disclosed herein may be used to interleave a plurality of user portions of the code-words, a plurality of the parity portion of the code-words, or a plurality of a combination of user portions of the code-words and the parity portions of the code-words.

Figure 2:
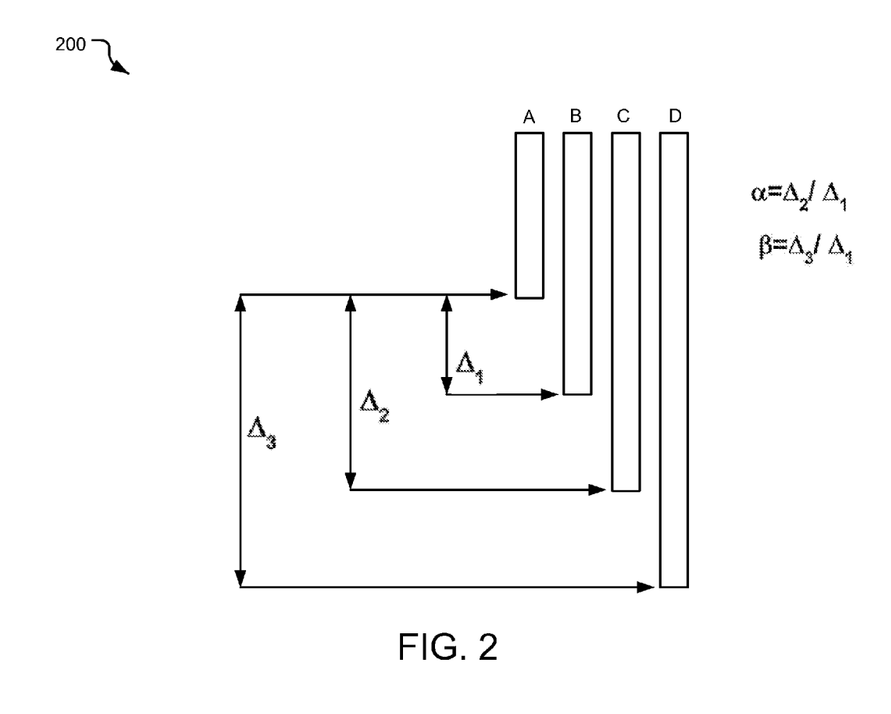
FIG. 2 illustrates the interleaving of code-words for an example implementation including four code-words.

Implementations herein provide generation of interleaved permuters for hard disk drive channel described for a case where multiple encoded code-words are concatenated to form a sector. The interleaving process would be performed easily if all the code-words had the same length but this is generally not the case and the code-words may be different in length. As a result, we end up with $2^{(m-1)}$ possible cases with different combinations of code-words, where m is the number of combined code-words. For each case, the implementation disclosed herein provides a procedure (algorithm) to generate the corresponding interleaved permuter. In general, these procedures (algorithms) are characterized by $(2m-3)$ parameters $\Delta_i$, $i=1, 2, \ldots, m-1$ and $\alpha_i = \Delta_{i+1}/\Delta_1$, $i=1, 2, \ldots, m-2$. FIG. 2 shows the special case with m=4 code-words and 5 associated parameters.

In one implementation, the process of interleaving concatenates multiplets (a certain number of bits) from each code-word alternately without having two successive multiplets from a given code-word. Every m concatenated multiplets from the m code-words form one symbol. Specifically, the implementations provided herein disclose detailed algorithms for the case where m=4. However, these procedures may be generalized naturally to any integer value of m.

In addition to combating burst errors, the method of generating interleaved combination also helps reduce channel inter-symbol interference (ISI) within individual code-words as well as having strong code-words help weaker code-words during the decoding process.

Figure 1:
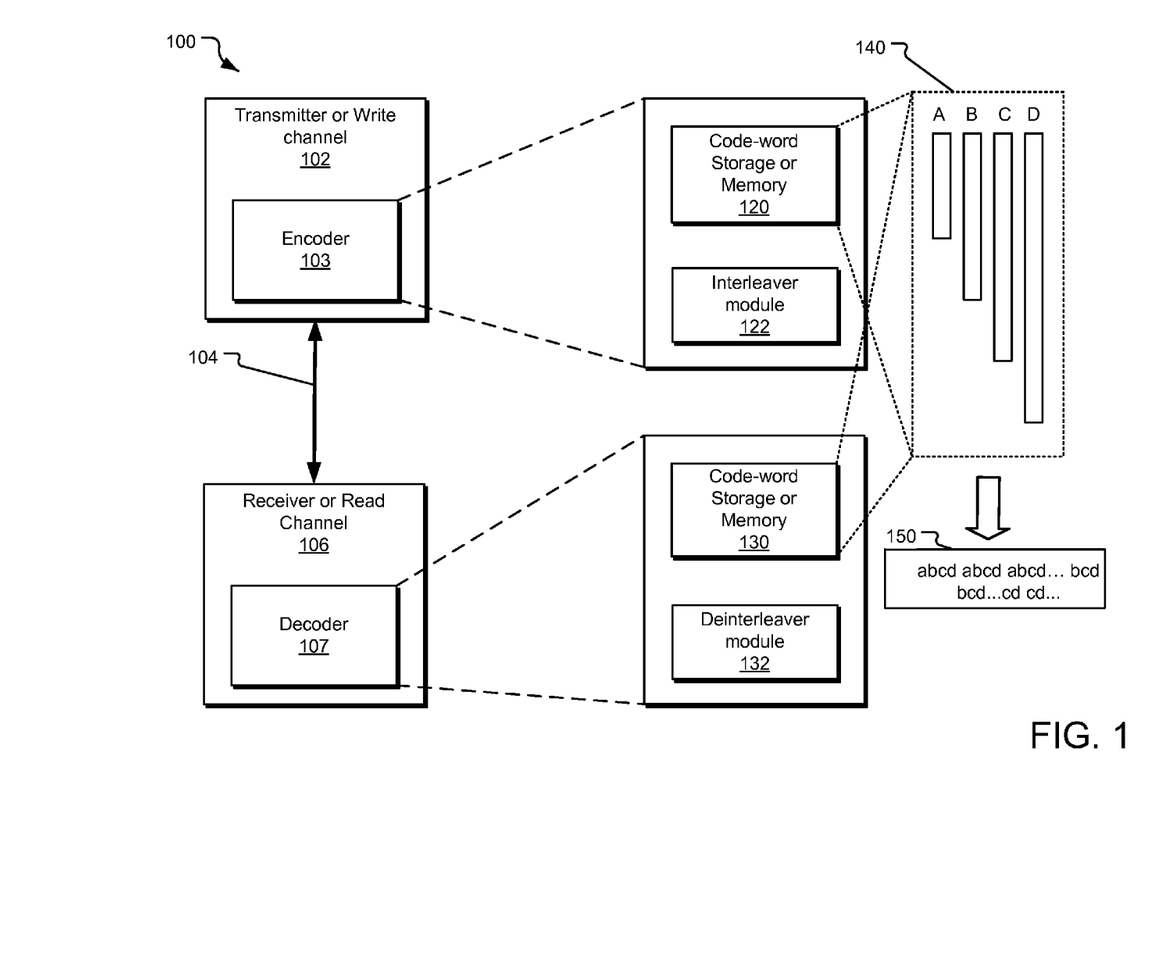
FIG. 1 is a diagram of a storage device with a communications channel, in accordance with certain embodiments of the present disclosure.

Referring to FIG. 1, a diagram of a communication channel or storage device system is shown and generally designated 100. The system may include a transmitter 102 with an encoder 103, a transmission medium 104, and a receiver 106 with a decoder 107. The transmitter 102 and the receiver 106 may be in a same device or may be in separate devices. Further, the transmission medium 104 may be any type of transmission medium, such as a signal transmission medium or a data storage medium (not shown).

The encoder 103 and the decoder 107 may be implemented using various schemes with error correcting code (ECC). As such, encoder 103 may include one or more encoders and decoder 107 may include one or more decoders. Bits from the encoder(s) 103 can be interleaved before they are transmitted to a communications medium. During receiving, or read back, the decoder(s) 107 can have stronger ECC decoders that can help with weaker decoders through detector/decoder iterations. Further, the encoders and decoders may have different code rates.

The encoding and decoding schemes disclosed herein can use multiple ECC encoders and decoders with varying code rates. Bits, or collection of bits, from each code-word can be interleaved (i.e. permuted) before they are transmitted (in some cases, transmission may include writing to one or more data storage medium). In some of the example schemes, information can be exchanged between a soft-decision detector that estimates bits according to a memory in the channel and multiple soft-decision decoders for the different ECC codes that estimate the bits according to the constraints imposed within each ECC code.

Different variations of the iterative detector-decoder schedule are disclosed herein. In general, stronger ECC will converge first and will help weaker ECC codes through iteration with a detector with memory. By optimizing the strengths of each ECC code in such schemes, performance and reliability can be improved.

In some examples, the transmitter 102 may be a write channel of a data storage device (DSD), the transmission medium 104 may be a data storage medium of the DSD, and the receiver 106 may be a read channel of the DSD. For example, the channel in a disc drive or other DSD can be a channel with memory. While the scheme disclosed herein is applicable to any communication system or communication channel with memory, the discussion will focus mainly on a write and read channel for a DSD, such as a hard disc drive.

In an example implementation of the communication channel 100 disclosed herein, the encoder 103 includes a code-word memory or storage space 120 to save a plurality of code-words and an interleaver module 122 that interleaves the plurality of code-words 140 (e.g., code-words=A, B, C, D, etc.). In one implementation, the interleaver module 122 is configured to interleave the plurality of code-words 140 to generate a plurality of multiplet sequences 150 (e.g., an example of multiplet sequence=abcd, wherein a is a multiplet from code-word A, b is a multiplet from code-word B, etc.).

Furthermore, an example implementation of the communication channel 100 disclosed herein, the decoder 107 includes a code-word memory or storage space 130 to save a plurality of code-words and a de-interleaver module 132 that de-interleaves the plurality of code-words. In yet another alternative implementation, the encoder 103 and the decoder 107 may share the same code-word storage space 120 (130).

FIG. 2 illustrates the interleaving 200 of four code-words for an example implementation including four code-words A, B, C, and D. Specifically, FIG. 2 shows a layout 200 of the four code-words A, B, C, and D in an ascending order of lengths of the code-words. Thus, in the given example, each of the four code-words A, B, C, and D are of different lengths with the length of code-word A being the shortest and the length of the code-word D being the longest. The differences between the first (shortest) code-word A and the other three code-words B, C, and D (arranged in ascending order of length) are given by $\Delta_1$, $\Delta_2$, and $\Delta_3$. Specifically, if the lengths of the four code-words A, B, C and D are defined by $L_a$, $L_b$, $L_c$, and $L_d$, then $\Delta_1 = L_b - L_a$, $\Delta_2 = L_c - L_a$, and $\Delta_3 = L_d - L_a$. The lengths here can be in bits, multiplets, or symbols.

Furthermore, the relationships between the sizes of the four code-words A, B, C, and D can be further defined by two additional parameters defined as $\alpha = \Delta_2/\Delta_1$ and $\beta = \Delta_3/\Delta_1$. Each combination of the relative lengths of the code-words A, B, C, and D can be defined by these five parameters. Specifically, the values of the three parameters $\Delta_1$, $\Delta_2$, and $\Delta_3$ will define the eight possible cases of combining the four code-words. These cases are listed in Table 1 below and further illustrated in the following figures. Specifically, in the following figures, each of the four code-words are designated by A, B, C, and D, and the corresponding multiplets are designated by a, b, c, and, d. The corresponding lengths of the code-words A, B, C, and D, are designated by $L_a$, $L_b$, $L_c$, and $L_d$.

TABLE 1

| Case | # | $\Delta_1$ | $\Delta_2$ | $\Delta_3$ | Parameters | # Regions |
|---|---|---|---|---|---|---|
| $L_a L_a L_a L_a$ | 0 | = 0 | = 0 | = 0 | $\Delta_1 = \Delta_2 = \Delta_3 = 0$ | 1 |
| $L_a L_a L_a L_b$ | 1 | = 0 | = 0 | > 0 | $\Delta_1 = \Delta_2 = 0, \Delta_3,$ $X = \Delta_3/2$ | 2 |
| $L_a L_a L_b L_b$ | 2 | = 0 | > 0 | > 0 | $\Delta_1 = 0, \Delta_2 = \Delta_3,$ | 2 |
| $L_a L_b L_b L_b$ | 3 | > 0 | > 0 | > 0 | $\Delta_1 = \Delta_2 = \Delta_3$ | 2 |
| $L_a L_b L_b L_c$ | 4 | > 0 | > 0 | > 0 | $\Delta_1 = \Delta_2, \Delta_3, X =$ $(\Delta_3 - 2\Delta_2)/2$ | 2, 3 |
| $L_a L_b L_c L_c$ | 5 | > 0 | > 0 | > 0 | $\Delta_1, \Delta_2 = \Delta_3,$ | 3 |
| $L_a L_b L_c L_d$ | 6 | > 0 | > 0 | > 0 | $\Delta_1, \Delta_2, \Delta_3, \alpha =$ $\Delta_2/\Delta_1, \beta = \Delta_3/\Delta_1$ $X = (\Delta_3 - \Delta_2 - \Delta_1)/2$ | |
| $L_a L_a L_b L_c$ | 7 | = 0 | > 0 | > 0 | $\Delta_1 = 0, \Delta_2, \Delta_3,$ $X = (\Delta_3 - \Delta_2)/2$ | 3 |

For each of the case#0-7, described below in FIGS. 3-8, some cases may have multiple variants, depending on some parameter values (for example, implementation specific restrictions on code-word, sequence, or multiplet size). For each figure, the corresponding parameters are given as well as the different repetitions of the multiplets for each interleaving region. For example, when 3 bits are used to form a multiplet, it is referred to as a triplet.

Figure 3:
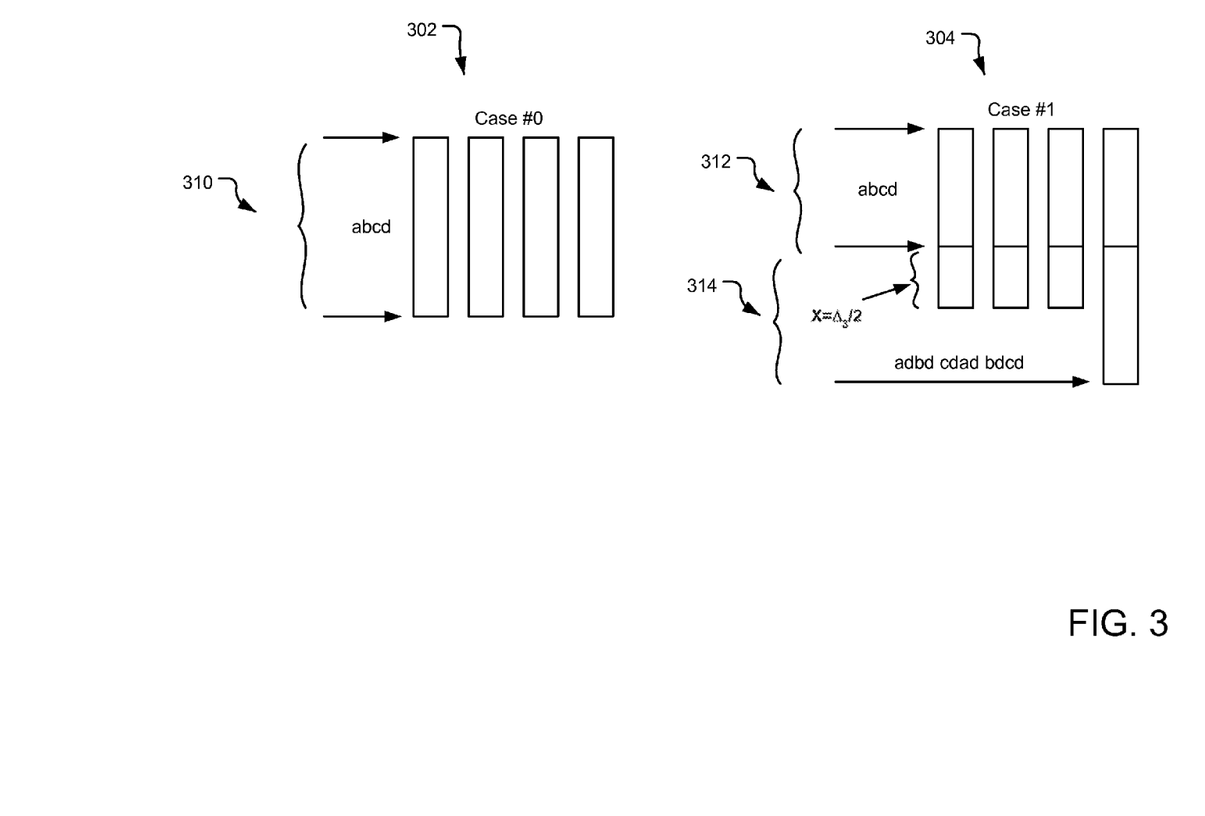
FIG. 3 illustrates an example arrangement of code-words, in accordance with certain embodiments of the present disclosure.

FIG. 3 illustrates case #0 302 and case #1 304. Specifically, for case #0, each of the four code-words A, B, C, and D have the same length. Therefore, case #0 has only one interleaving region 310 and the multiplets abcd are repeated over and over to the end of the code-words since all four code-words are supposed to have the same length. This results in generation of multiple pattern sequences abcd until the end of the code-words.

On the other hand, the arrangement 304 shows two regions 312 and 314 of interleaving for case #1. Specifically, in this case, $\Delta_1 = \Delta_2 = 0$ and $\Delta_3 > 0$. Let X be such that $\Delta_3 + X = 3X$, which gives $X = \Delta_3/2$. The steps of multiplets interleaving in this case are given by (i) repeat the interleaved multiplets abcd for region 312 and stop before exhausting the multiplets in code-words A, B, and C at a point where the remaining lengths of code-words A, B, and C equal X; and (ii) interleave for region 314 by repeating the multiplet sequence adbd cd|ad bdcd to the end. As a result, the first region 312 repeats the multiplets abcd until the remaining lengths of code-words A, B, and C is equal to X. The second region 314 repeats the multiplet sequence adbd cd|ad bdcd to the end. In one implementation, the end of the first region 312 is determined by the parameter $X=\Delta_3/2$ to ensure that second region 314 has an integer number of multiplet sequence repetitions. For all eight cases described in FIG. 3-8, the multiplet sequences include an integer number of symbols (here with four code-words, each symbol has four multiplets).

Figure 4:
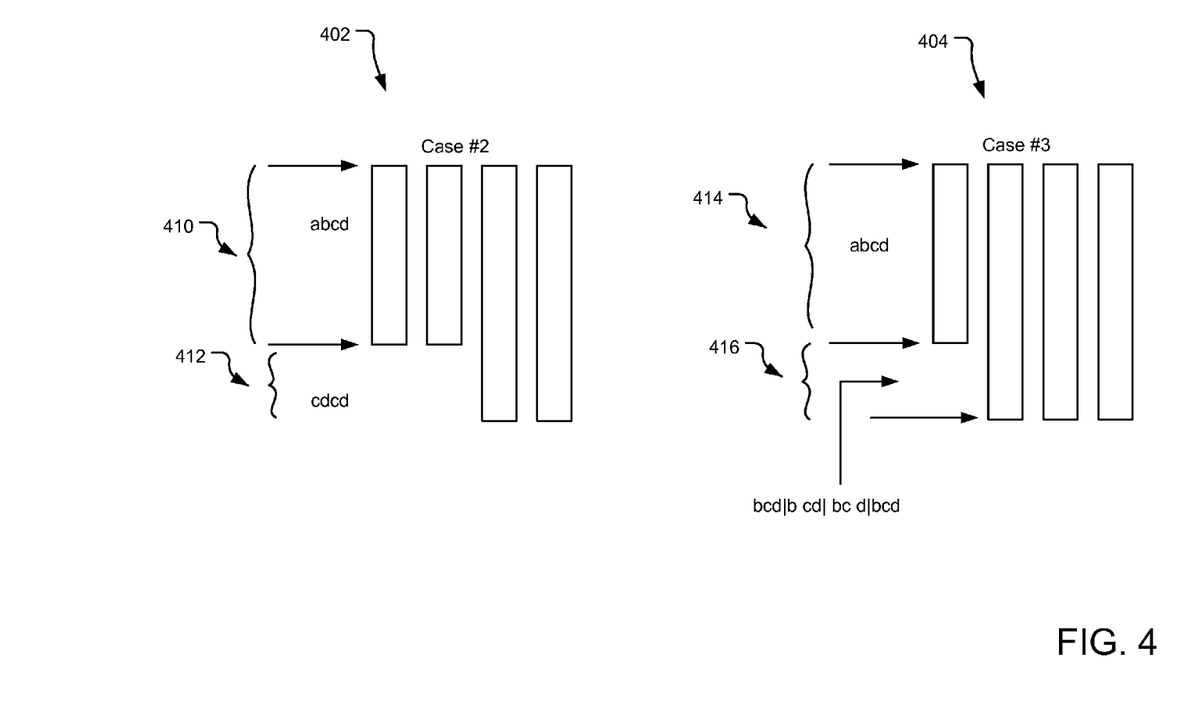
FIG. 4 illustrates an alternative example arrangement of code-words, in accordance with certain embodiments of the present disclosure.

FIG. 4 illustrates a combination 402 of code-words for case #2 and a combination 404 of code-words for case #3. For case #2, $\Delta_1=0$, $\Delta_2>0$ and $\Delta_3>0$, where $\Delta_2=\Delta_3$. In this case, the interleaving procedure is executed as follows: (i) interleave the multiplets abcd until exhausting code-words A and B simultaneously for region 410 and (ii) interleave multiplets cdcd to the end for region 412.

For case #3, $\Delta_1=\Delta_2=\Delta_3>0$. In this case, the interleaving procedure is as follows: (i) in region 414 interleave the multiplets abcd until code-word A is exhausted and (ii) in region 416 interleave code-words B, C, and D using 3 symbols at a time bcd|b cd|bc d|bcd. Here the pattern sequence to be repeated should consist of an integer number of symbols, the reason why the pattern bcd is repeated four times.

Figure 5:
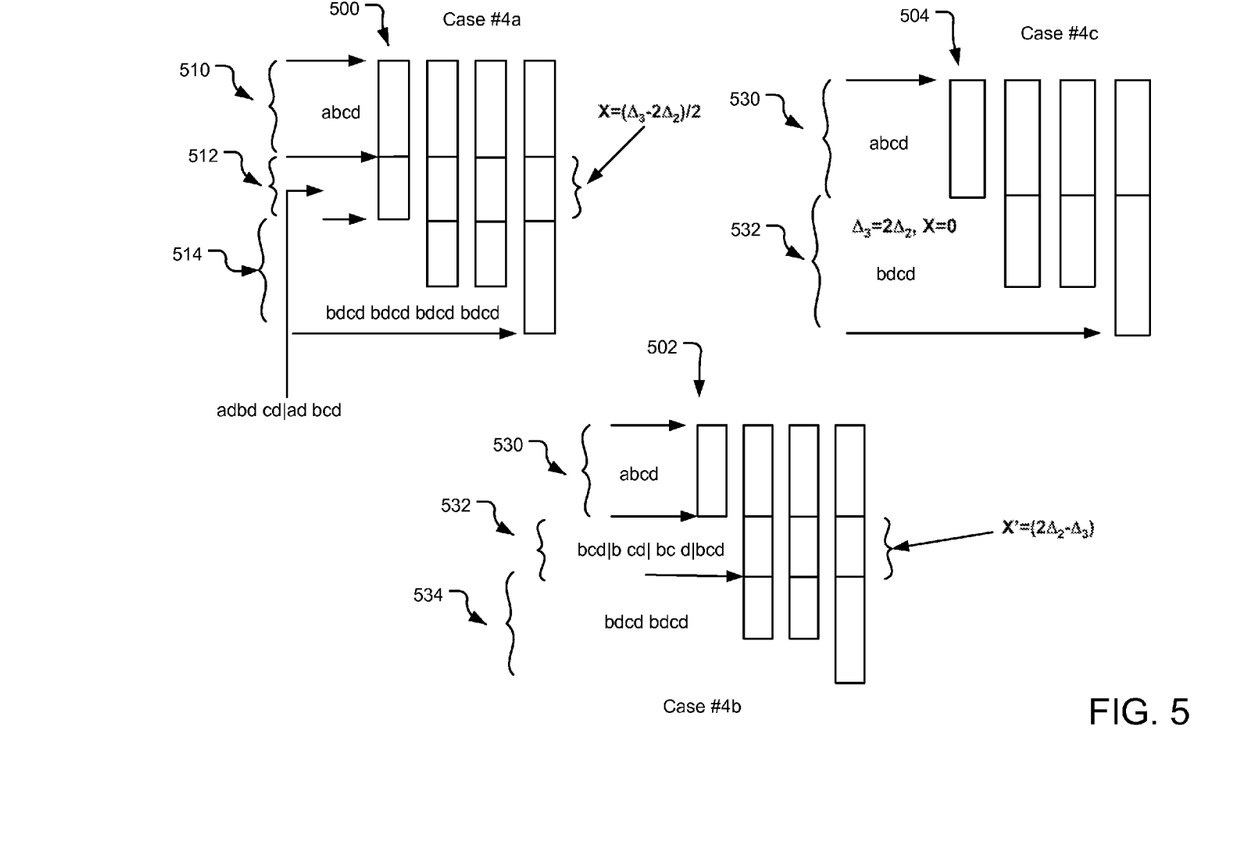
FIG. 5 illustrates yet another alternative example arrangement of code-words, in accordance with certain embodiments of the present disclosure.

FIG. 5 illustrates other cases 500, 502, and 504 of code-words for case #4. For case #4, $\Delta_1>0$, $\Delta_2>0$, and $\Delta_3>0$, where $\Delta_1=\Delta_2$. Let $X=(\Delta_3-2\Delta_2)/2$ and $X'=-2X$. In this case, there are three different sub-cases depending on the sign of a parameter $X=(\Delta_3-2\Delta_2)/2$, whether X is positive (500), negative (502), or zero (504). And for each sub-case there are different regions of multiplet repetitions.

For sub-case 500 (X>0), the interleaving procedure is as follows: (i) in the region 510, interleave abcd and stop before exhausting code-word A at the point where the remaining length of A is X, (ii) in the region 512, interleave the multiplet sequence adbd cd|ad bdcd at a time and continue until exhausting A; and (iii) in the region 514, interleave bdcd to the end. Each time the pattern sequence to be repeated has to include an integer number of symbols.

For sub-case 502 (X<0), the interleaving procedure is as follows: (i) in the region 530, interleave abcd until exhausting code-word A, (ii) in the region 532, interleave bcd|b cd|bc d|bcd at a time and continue for a length equals X'; and (iii) in the region 534, interleave bdcd to the end.

For sub-case 504 (X=0), the interleaving procedure is as follows: (i) in the region 520, interleave the multiplets abcd until exhausting code-word A and (ii) in the region 522, interleave the multiplets bdcd to the end.

Figure 6:
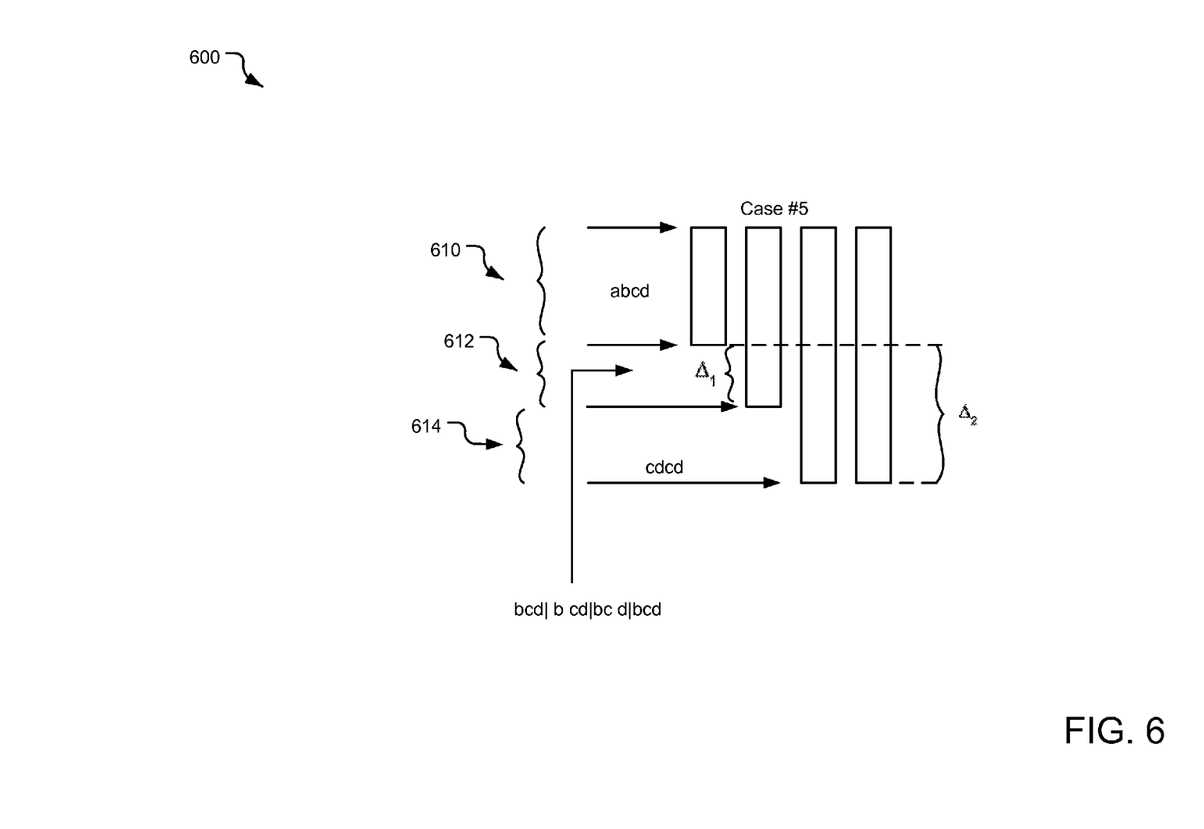
FIG. 6 illustrates yet alternative example arrangement of code-words, in accordance with certain embodiments of the present disclosure.

FIG. 6 illustrates a combination 600 of code-words for case #5. Specifically, for case #5, $\Delta_1>0$, $\Delta_2>0$, and $\Delta_3>0$, where $\Delta_2=\Delta_3$. In this case, the interleaving is performed using the following steps: (i) In region 610, interleave the multiplets abcd until exhausting code-word A, (ii) in region 612, interleave the multiplet sequence bcd|b cd|bc d|bcd at a time until exhausting code-word B, and (iii) in region 614, interleave the multiplets cdcd to the end.

Figure 7:
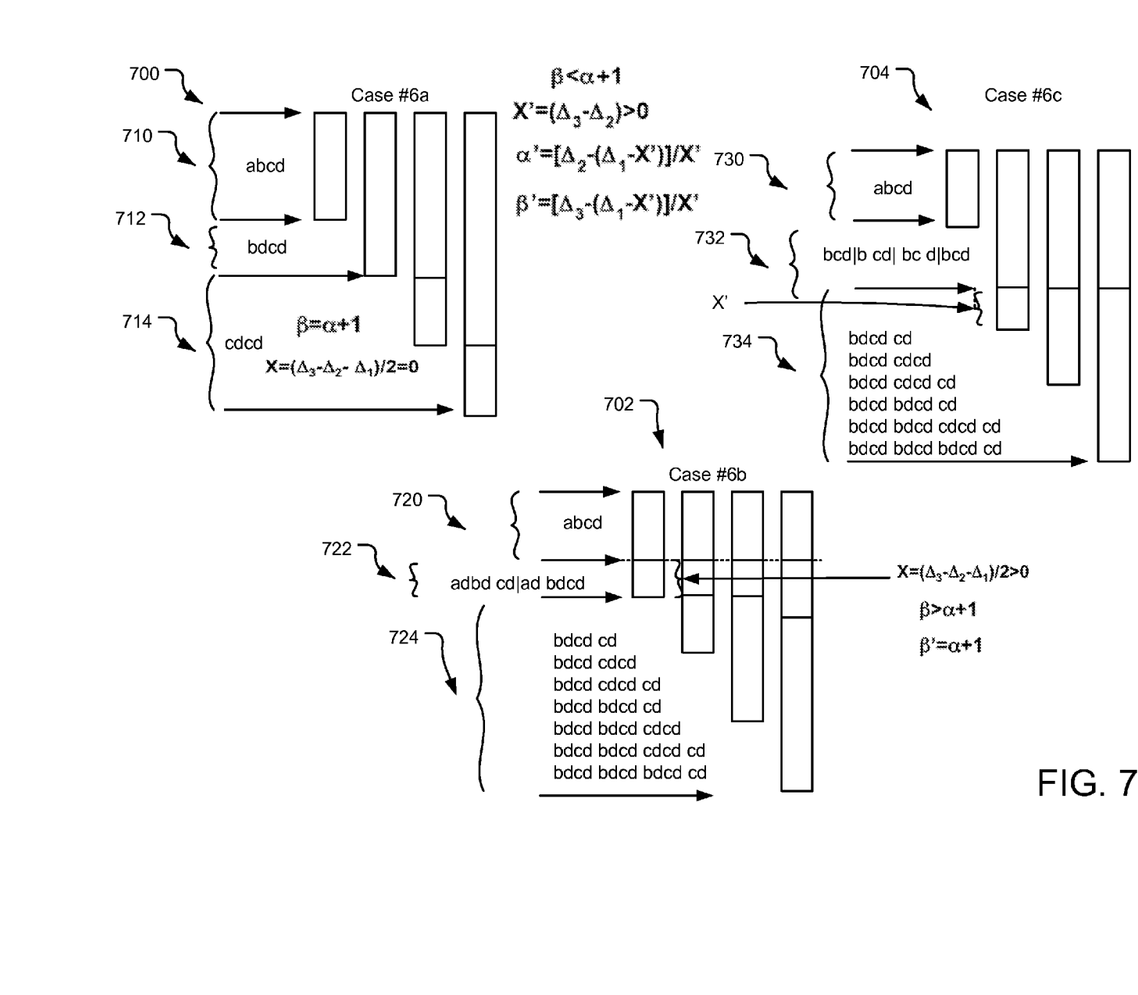
FIG. 7 illustrates yet alternative example arrangement of code-words, in accordance with certain embodiments of the present disclosure.

FIG. 7 illustrates a combination 700, 702, and 704 of code-words for case #6. This case has $\Delta_3>\Delta_2>\Delta_1>0$. Let $\alpha=\Delta_2/\Delta_1$ and let $\beta=\Delta_3/\Delta_1$. For Case #6, there are three sub-cases depending on the relationship between the parameters $\alpha+1$ and $\beta$.

For sub-case 700, where $\beta=1+\alpha$ (in this case $\Delta_3=\Delta_2+\Delta_1$), the interleaving is performed using the following steps: (i) in region 710, interleave the multiplets abcd until code-word A is exhausted, (ii) in region 712, interleave multiplets from code-words B, C, and D using the sequence bdcd until code-word B is exhausted, and (iii) in region 714, interleave multiplets from code-words C and D as cdcd until the end.

Here when code-word B is exhausted, the remaining of code-word C is equal to the remaining of code-word D.

For sub-case 702, where $\beta>1+\alpha$, the interleaving is performed using the following steps: (i) in region 720, interleave multiplets abcd and stop before exhausting code-word A at the point where the remaining length of A equals $X=(\Delta_3-\Delta_2-\Delta_1)/2$, (ii) in region 722, interleave the multiplets adbd cd|ad bdcd until exhausting code-word A, and (iii) in region 724, first determine $\beta'=\beta-2X/\Delta_1$ (notice that $\beta'=1+\alpha$). If $\alpha$ and $\beta'$ are not integers, then find the smallest positive integer n such that $n\alpha$ and $n\beta'$ are both integers. Then, interleave code-words B, C, and D by repeating multiplets c and d $n\alpha$ and $n\beta'$ times, respectively for each b repeated n times. For this case, n may take one of the values 1, 2, or 3 as shown in Table 2, which gives all possible interleaving patterns for this case.

TABLE 2

| $n\alpha$ | $n\beta'$ | n | Interleaved Triplets for Code Words B, C, and D |
|---|---|---|---|
| 2 | 3 | 1 | bdcd cd\| . . . |
| 3 | 4 | 1 | bdcd cdcd |
| 4 | 5 | 1 | bdcd cdcd cd\| . . . |
| 5 | 6 | 1 | bdcd cdcd cdcd |
| 6 | 7 | 1 | bdcd cdcd cdcd cd\| . . . |
| 7 | 8 | 1 | bdcd cdcd .cdcd cdcd |
| 3 | 5 | 2 | bdcd bdcd cd\| . . . |
| 4 | 6 | 2 | bdcd bdcd cdcd |
| 5 | 7 | 2 | bdcd bdcd cdcd cd\| . . . |
| 4 | 7 | 3 | bdcd bdcd bdcd cd . . . |

For sub-case 704, where $\beta<1+\alpha$, the interleaving is performed using the following steps: (i) in region 730, interleave multiplets abcd until exhausting code-word A, (ii) in region 732, interleave bcd|b cd|bc d|bcd and stop before exhausting code-word B at the point where the remaining length of B equals $X'=(\Delta_3-\Delta_2)$. Note that $X'<\Delta_1$, and (iii) in region 734, compute $\alpha'=[\Delta_2-(\Delta_1-X')]/X'$ and $\beta'=[\Delta_3-(\Delta_1-X')]/X'$.

If $\alpha'$ and $\beta'$ are not integers, then find the smallest positive integer n such that $n\alpha'$ and $n\beta'$ are both integers. Then, interleave multiplets from code-words B, C, and D by repeating multiplets c and d, $n\alpha'$ and $n\beta'$ times, respectively for each b repeated n times. For this case, n may take one of the values 1, 2, or 3 as shown in Table 3, which gives all possible interleaving patterns for this case.

TABLE 3

| $n\alpha'$ | $n\beta'$ | n | Interleaved Triplets for Code Words B, C, and D |
|---|---|---|---|
| 2 | 3 | 1 | bdcd cd\| . . . |
| 3 | 4 | 1 | bdcd cdcd |
| 4 | 5 | 1 | bdcd cdcd cd\| . . . |
| 5 | 6 | 1 | bdcd cdcd cdcd |
| 6 | 7 | 1 | bdcd cdcd cdcd cd\| . . . |
| 3 | 5 | 2 | bdcd bdcd cd\| . . . |
| 5 | 7 | 2 | bdcd bdcd cdcd cd\| . . . |
| 4 | 7 | 3 | bdcd bdcd bdcd cd\| . . . |

Figure 8:
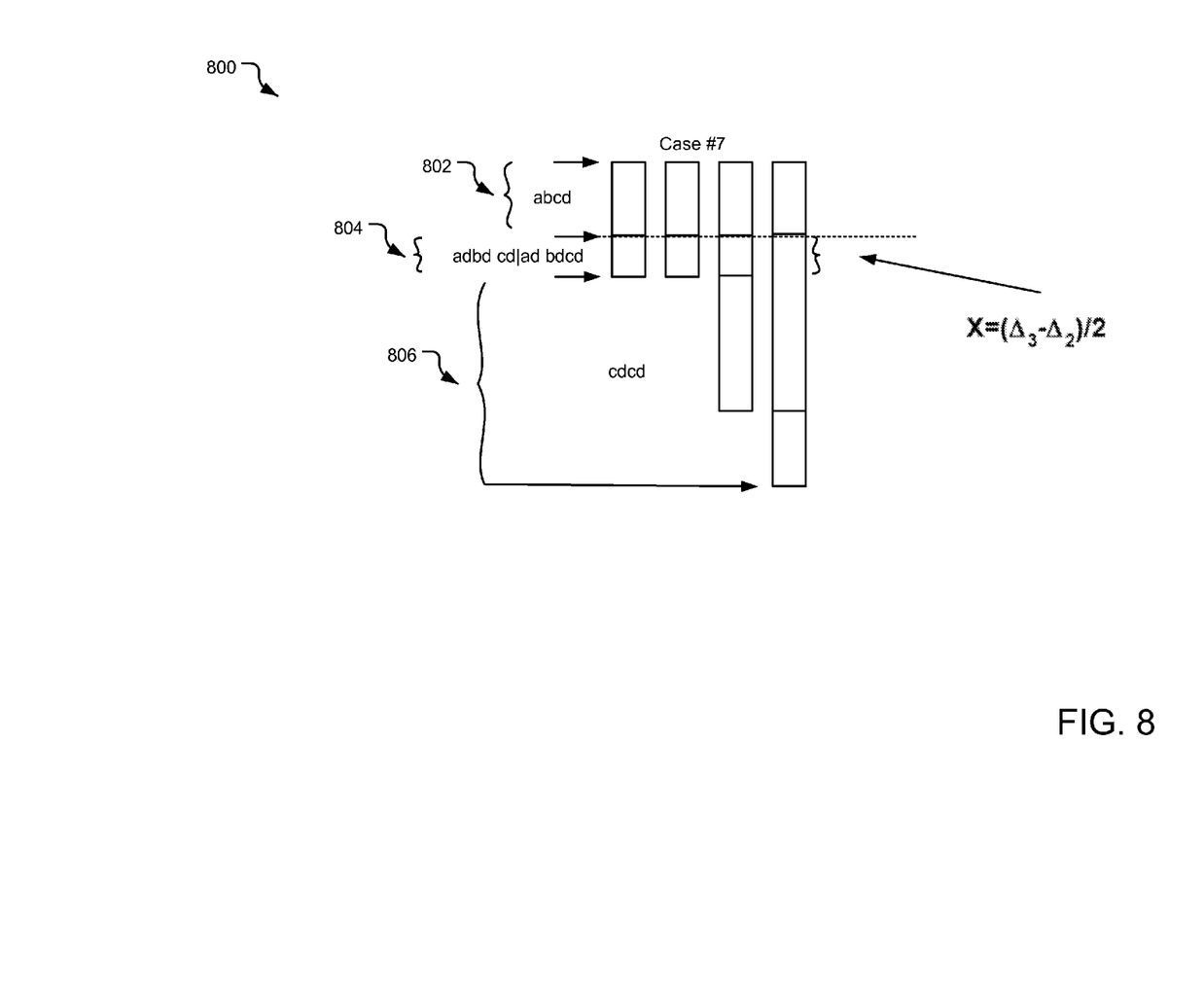
FIG. 8 illustrates yet alternative example arrangement of code-words, in accordance with certain embodiments of the present disclosure.

FIG. 8 illustrates a combination 800 of code-words for case #7. This case has $\Delta_1=0$ and $\Delta_3>\Delta_2>0$. Let $\alpha=\Delta_2/\Delta_1$, $\beta=\Delta_3/\Delta_1$, and $X=(\Delta_3-\Delta_2)/2$. The interleaving is performed as follows: (i) in region 802, interleave abcd and stop before exhausting code-word A at the point where the remaining length of A equals X, (ii) in region 804, interleave adbd cd|ad bdcd until exhausting code-words A and B, and (iii) in region 806, interleave cd|cd, to the end.

Figure 9:
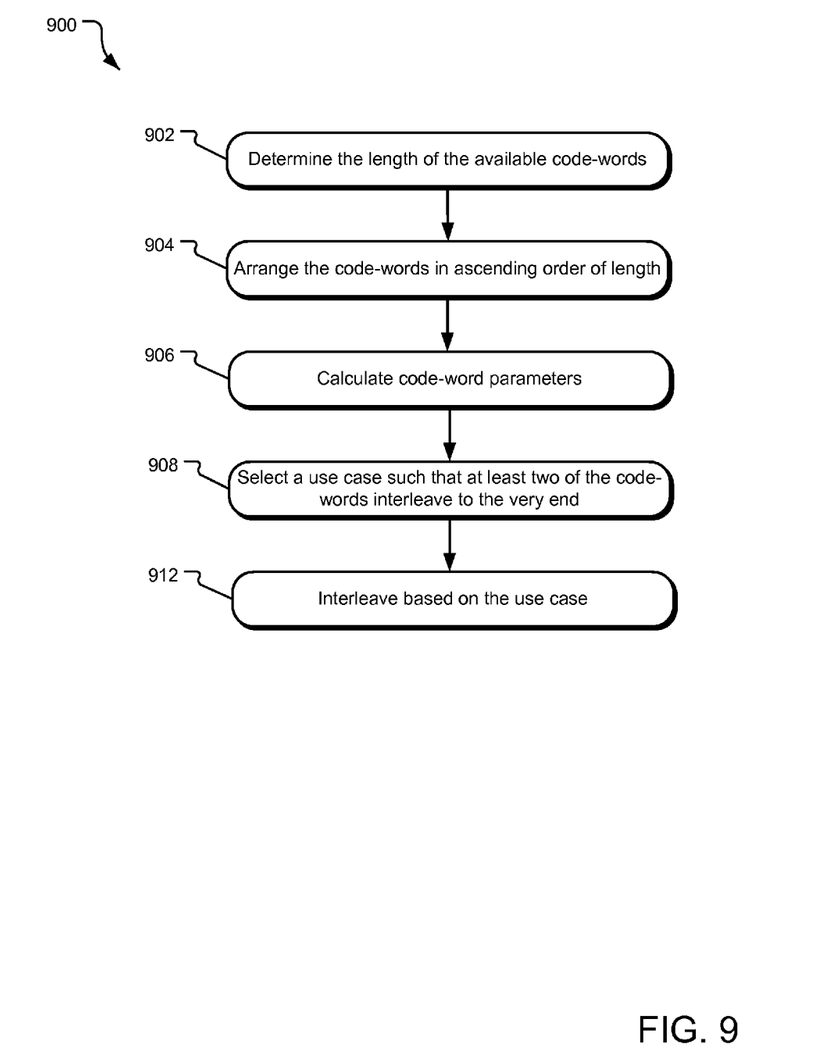
FIG. 9 illustrates a flowchart including operations for interleaving multiple code-words.

FIG. 9 illustrates a flowchart 900 including operations for interleaving multiple code-words to generate multiplet sequences. Specifically, the flowchart 900 includes operations for interleaving code-words such that for each of the multiplet sequences no two successive multiplets are from the same code-word, a multiplet including a plurality of bits from a single code-word. The operations illustrated in the flowchart 900 may be applicable to any combination of code-words including at least three code-words.

An operation 902 determines the lengths of each of the code-words. For interleaving user data, the operation 902 may determine the length of the user data bits for each of the code-words. Alternatively, for interleaving parity bits, the operation 902 may determine the length of the parity bits for each of the code-words.

Subsequently, an operation 904 arranges the code-words in ascending order based on their lengths. Such arrangement of the code-words may result in multiple code-words of the same length being arranged next to each other. Note that the arranging operation does not require actual physical arrangement of the code-words in memory. Instead, for example, pointers to the code-words may be arranged to specify the order of the code-words. An operation 906 calculates various parameters defining the relationships between the lengths of the plurality of code-words. For example, if the plurality of code-words includes four code-words with lengths of $L_a$, $L_b$, $L_c$, and $L_d$, the operation 906 calculates five parameters, namely $\Delta_1=L_b-L_a$, $\Delta_2=L_c-L_a$, $\Delta_3=L_d-L_a$, $\alpha=\Delta_2/\Delta_1$, and $\beta=\Delta_3/\Delta_1$. Note that in an alternative implementation, depending on the number of code-words, more or less number of parameters may be selected.

Subsequently, an operation 908 selects a use case from a plurality of use cases such that at least two of the code-words interleave to the very end of the interleaving process. Such use cases depend on the number of code-words. For example, the previous disclosure illustrates eight use cases that are based on given values of the parameters for an implementation using four code-words. An operation 912 interleaves the plurality of code-words using the selected use-case.

Further, the code-words themselves maybe divided into k sub-sections for k>=1. For example, code-word A may be grouped into $A^{(1)}$, $A^{(2)}$, ..., $A^{(k)}$, and code-word B may be divided into $B^{(1)}$, $B^{(2)}$, ..., $B^{(k)}$, etc. The interleaving procedure described herein may be applied separately to each subsection of the code-words. For interleaving the $i^{th}$ sub-sections, we may denote $A^{(i)}$, $B^{(i)}$, ... as the new code-words and apply the operations in 902, 904, 906, 908, and 912 described above. The sub-sections within each code-word are created such that the new code-words described above adhere to the same restrictions on the lengths as the original code-words described in this specification.

In the above detailed description of the embodiments, reference is made to the accompanying drawings which form a part hereof, and in which are shown by way of illustration of specific embodiments. It is to be understood that features of the various described embodiments may be combined, other embodiments may be utilized, and structural changes may be made without departing from the scope of the present disclosure.

In accordance with various embodiments, the methods and systems described herein may be implemented as one or more software programs running on a computer processor or controller device. In accordance with other embodiments, the methods and software described herein may be implemented as one or more software programs running on a computing device, such as a personal computer that is using a data storage device such as a disc drive. Dedicated hardware implementations including, but not limited to, application specific integrated circuits, programmable logic arrays, and other hardware devices can likewise be constructed to implement the methods and systems described herein. Further, the methods described herein may be implemented as a computer readable data storage medium or device storing instructions that when executed cause a processor to perform the methods.

The illustrations of certain embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. A storage device comprising:
   a memory; and
   a write channel configured to perform an interleaving process on a plurality of code-words to generate a plurality of multiplet sequences such that at least two of the plurality of code-words interleave until the at least two of the plurality of code-words are exhausted.

2. The storage device of claim 1, wherein for each of the multiplet sequences no two successive multiplets are from the same code-word, a multiplet including a plurality of bits from a single code-word.

3. The storage device of claim 1, wherein each of the plurality of code-words is an ECC code-word.

4. The storage device of claim 1, further comprising a read channel configured to de-interleave the plurality of multiplet sequences.

5. The storage device of claim 1, wherein the plurality of code-words includes at least three code-words.

6. The storage device of claim 1, wherein the write channel is further configured to:
   determine lengths of each of the plurality of code-words;
   organize the plurality of code-words in an ascending order; and
   compute parameters relating to number of the plurality of code-words and lengths of the plurality of code-words to perform the interleaving process.

7. The storage device of claim 1, wherein each of the plurality of code-words is one of a user portion of an ECC code-word or a parity portion of the ECC code-word.

8. The storage device of claim 7, wherein the write channel is configured to interleave at least one of: a plurality of user portions of the code-words, a plurality of parity portions of the code-words, and a plurality of a combination of user portions and parity portions of the code-words.

9. The storage device of claim 1, wherein the plurality of code-words includes four code-words, and the write channel is further configured to determine values of five parameters defining the possible relations between the lengths of the four code-words.

10. The storage device of claim 1, wherein the plurality of code-words includes four code-words having lengths, in ascending order, of $L_a$, $L_b$, $L_c$, and $L_d$, and the write channel is further configured to determine values of $\Delta_1 = L_b - L_a$, $\Delta_2 = L_c - L_a$, $\Delta_3 = L_d - L_a$, $\alpha = \Delta_2/\Delta_1$, and $\beta = \Delta_3/\Delta_1$.

11. The storage device of claim 8, wherein the write channel is further configured to select one of eight use cases based on the values of $\Delta_1$, $\Delta_2$, $\Delta_3$, $\alpha$, and $\beta$.

12. The storage device of claim 11, wherein the plurality of code-words includes m code-words having lengths in ascending order, and the write channel is further configured to determine the values of $\Delta_i$, i=1, 2, . . . , m−1 and $\alpha_i = \Delta_{i+1}/\Delta_1$, i=1, 2, . . . , m−2.

13. The storage device of claim 11, wherein the write channel is further configured to interleave the plurality of code-words using a selected use case.

14. A communication channel comprising:
an encoder configured to:
store a plurality of code-words;
interleave the plurality of code-words to generate a plurality of sequences such that at least two of the plurality of code-words interleave until the at least two of the plurality of code-words are exhausted; and
a decoder configured to de-interleave the plurality of sequences.

15. The communication channel of claim 14, wherein the plurality of code-words includes at least three code-words.

16. The communication channel of claim 14, wherein the encoder is further configured to interleave the code-words such that for each of the sequences no two successive sequences are from the same code-word, a sequence including a plurality of bits from a single code-word.

17. The communication channel of claim 14, wherein the encoder is further configured to interleave the plurality of code-words by:
determining the lengths of each of the plurality of code-words;
organizing the plurality of code-words in an ascending order;
calculating a plurality of parameters specifying relationships between lengths of each of the plurality of code-words and a number of code-words; and
selecting one of a plurality of use cases based on the parameters.

18. The communication channel of claim 17, wherein the lengths of the plurality of code-words are $L_a$, $L_b$, $L_c$, and $L_d$, and the encoder is further configured to calculate values of $\Delta_1 = L_b - L_a$, $\Delta_2 = L_c - L_a$, $\Delta_3 = L_d - L_a$, $\alpha = \Delta_2/\Delta_1$, and $\beta = \Delta_3/\Delta_1$.

19. The communication channel of claim 17, wherein the encoder is further configured to select one of eight use cases based on the parameters.

20. A physical article of manufacture including one or more tangible computer-readable storage media, encoding computer-executable instructions for executing on a computer system a computer process, the computer process comprising:
determining lengths of a plurality of code-words in a communication channel with memory;
arranging the plurality of code-words in ascending order based on the lengths of the plurality of code-words; and
calculating parameters specifying relationships between the lengths of the plurality of code-words and a number of code-words.

21. The physical article of manufacture of claim 20, further comprising selecting one of a plurality of use cases based on the parameters, each of the plurality of use cases specifying an interleaving process that allows interleaving the plurality of code-words such that at least two of the plurality of code-words interleave until a completion of interleaving process.

22. The physical article of manufacture of claim 20, further comprising interleaving the plurality of code-words based on a selected use case.

23. The physical article of manufacture of claim 20, wherein each of the plurality of code-words is an ECC code-word using at least one of LDPC code, RS code, BCH code, or a combination of LDPC code, RS code, and BCH code.

* * * * *